United States Patent
Lei et al.

(10) Patent No.: US 9,733,316 B2
(45) Date of Patent: Aug. 15, 2017

(54) TRIAXIAL MAGNETIC FIELD SENSOR

(75) Inventors: Xiaofeng Lei, Zhangjiagang (CN);
Xiaojun Zhang, Zhangjiagang (CN);
Wei Li, Zhangjiagang (CN); Songsheng Xue, Zhangjiagang (CN)

(73) Assignee: MultiDemension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 14/239,786

(22) PCT Filed: Aug. 27, 2012

(86) PCT No.: PCT/CN2012/080600
§ 371 (c)(1),
(2), (4) Date: Feb. 20, 2014

(87) PCT Pub. No.: WO2013/029510
PCT Pub. Date: Mar. 7, 2013

(65) Prior Publication Data
US 2014/0247042 A1   Sep. 4, 2014

(30) Foreign Application Priority Data
Aug. 30, 2011  (CN) .......................... 2011 1 0251902

(51) Int. Cl.
*G01R 33/02* (2006.01)
*G01R 33/00* (2006.01)
(Continued)

(52) U.S. Cl.
CPC ..... *G01R 33/0206* (2013.01); *G01R 33/0005* (2013.01); *G01R 33/0052* (2013.01);
(Continued)

(58) Field of Classification Search
CPC .............. G01R 33/093; G01R 33/0206; G01R 33/0005; G01R 33/0052; G01R 33/028; G01R 33/038; G01R 33/09; G01R 33/096
(Continued)

(56) References Cited

U.S. PATENT DOCUMENTS 7,564,237 B2 * 7/2009 Rieger et al. ................. 324/244
2007/0096228 A1 * 5/2007 Ahn ....................... B82Y 25/00
257/421

(Continued)

FOREIGN PATENT DOCUMENTS

CN          1356559 A        7/2002
CN          101813479   *    8/2010 ............. G01C 17/30
(Continued)

OTHER PUBLICATIONS

CN101813479 Machine Translation, Aug. 25, 2010.*
(Continued)

*Primary Examiner* — Huy Q Phan
*Assistant Examiner* — Raul Rios Russo
(74) *Attorney, Agent, or Firm* — Schwegman Lundberg & Woessner, P.A.

(57) ABSTRACT

The present invention discloses a triaxial magnetoresistive sensor. It comprises a substrate integrated with a biaxial magnetic field sensor, a Z-axis sensor that has a sensing direction along Z-axis perpendicular to the two axes of the biaxial magnetic field sensor, and an ASIC. The biaxial magnetic field sensor comprises an X-axis bridge sensor and a Y-axis bridge sensor. The Z-axis sensor and the two-axis sensor are electrically interconnected with the ASIC. A single-chip implementation of the triaxial magnetic field sensor comprises a substrate, onto which a triaxial magnetic field sensor and an ASIC are stacked. The triaxial magnetic field sensor comprises an X-axis bridge sensor, a Y-axis
(Continued)

bridge sensor, and a Z-axis bridge sensor. The above design provides a highly integrated sensor with high sensitivity, low power consumption, good linearity, wide dynamic range, excellent thermal stability, and low magnetic noise.

14 Claims, 9 Drawing Sheets

(51) Int. Cl.
G01R 33/028 (2006.01)
G01R 33/09 (2006.01)

(52) U.S. Cl.
CPC ......... *G01R 33/093* (2013.01); *G01R 33/098* (2013.01); *G01R 33/028* (2013.01); *G01R 33/09* (2013.01); *G01R 33/096* (2013.01)

(58) Field of Classification Search
USPC ............... 324/207.13–207.21, 244–263
See application file for complete search history.

(56) References Cited

U.S. PATENT DOCUMENTS

| | | | |
|---|---|---|---|
| 2008/0272771 A1 | 11/2008 | Guo et al. | |
| 2009/0027048 A1* | 1/2009 | Sato .................... | B82Y 25/00 324/247 |
| 2009/0115405 A1 | 5/2009 | Guo et al. | |
| 2009/0243607 A1* | 10/2009 | Mather ................ | B82Y 25/00 324/249 |
| 2009/0315129 A1* | 12/2009 | Albertini ............. | B81B 7/0006 257/427 |
| 2010/0253330 A1* | 10/2010 | Sasaki ................. | B82Y 25/00 324/252 |
| 2011/0074406 A1* | 3/2011 | Mather et al. ........ | 324/252 |
| 2011/0147867 A1* | 6/2011 | Slaughter ............ | B82Y 25/00 257/427 |
| 2011/0234218 A1* | 9/2011 | Lagouge .............. | G01R 33/072 324/247 |
| 2011/0244599 A1* | 10/2011 | Whig .................... | B82Y 25/00 438/3 |
| 2012/0007598 A1* | 1/2012 | Lo ....................... | G01R 33/0011 324/252 |
| 2012/0268113 A1* | 10/2012 | Sato et al. .......... | 324/247 |
| 2012/0299587 A1* | 11/2012 | Rieger ................. | G01R 33/0206 324/247 |
| 2014/0225605 A1 | 8/2014 | Lei et al. | |

FOREIGN PATENT DOCUMENTS

| | | |
|---|---|---|
| CN | 102385043 A | 3/2012 |
| CN | 102426344 A | 4/2012 |
| CN | 202210145 U | 5/2012 |
| CN | 202362441 U | 8/2012 |
| EP | 2003462 A1 | 12/2008 |
| WO | WO-2006/070305 A1 | 7/2006 |
| WO | WO-2007/065377 A1 | 6/2007 |
| WO | WO-2009/119346 A1 | 10/2009 |
| WO | WO-2009/137802 A1 | 11/2009 |

OTHER PUBLICATIONS

CN 101813479 Machine Translation, Aug. 25, 2010.*
"European Application Serial No. 12828008.8, Supplementary European Search Report mailed Nov. 17, 2015", 14 pgs.
"International Application Serial No. PCT/CN2012/080600, Written Opinion mailed Nov. 29, 2012", (w/ English Translation), 19 pgs.
"International Application Serial No. PCT/CN2012/080600, International Preliminary Report on Patentability mailed Mar. 13, 2014", (w/ English Translation), 22 pgs.
"International Application Serial No. PCT/CN2012/080600, International Search Report mailed Nov. 29, 2012", (w/ English Translation), 8 pgs.

* cited by examiner

TRIAXIAL MAGNETIC FIELD SENSOR

CROSS-REFERENCE TO A RELATED APPLICATION

This application is a 35 U.S.C. §371 national phase application of PCT/CN2012/080600, filed on Aug. 27, 2012, which claims priority to a Chinese Patent Application No. CN201110251902, filed on Aug. 30, 2011, incorporated herein by reference in its entirety.

TECHNICAL FIELD

The invention relates to the design of the bridge type magnetic field sensor, in particular a three-axis magnetic field sensor.

BACKGROUND ART

In recent years Magnetic Tunnel Junctions (MTJ) have begun finding acceptance in industrial applications as a new type of magnetoresistive sensor, using the Tunneling Magnetoresistance (TMR) Effect of magnetic multilayer materials. In this effect the magnitude and direction of a magnetic field applied to the multilayered film changes the resistance of the multilayer film. The TMR effect is larger than the AMR (Anisotropic Magnetic Resistance) effect, and it also known to have better temperature stability than the Hall Effect. As a result, TMR magnetic field sensors have the advantages of higher sensitivity, lower power consumption, better linearity, wider dynamic range, better temperature characteristics, and lower noise than AMR, GMR, or Hall devices. Moreover, MTJs can be easily fabricated with existing chip manufacturing technology which facilitates the production of very small integrated magnetic field sensors.

Multi-axis magnetic field sensors generally have more than a single sensor chip integrated in the package, in order to provide vector measurement capability with good orthogonality. Because the magnetic field is a vector field, a multi-axis magnetic field sensor has a very wide range of applications, especially for electronic compass, which use biaxial or triaxial sensors for geomagnetic field measurements. As a result of this common application, simplified means of production of highly-integrated single-chip multi-axis magnetic field sensors are strongly desired.

When deposited on the same wafer, GMR and MTJ materials used for the different sensor axes have the same magnetic moments, and after annealing have the same pinned layer direction, which makes fabrication of single-chip three-axis sensors difficult. As such, the most common approach to manufacture a GMR triaxial sensor is to package an X-axis sensor, a Y-axis sensor, and a Z-axis sensor deposited on three different substrates; such a GMR triaxial sensor suffers limitations such as excessive size, high packaging cost, and it has a lower sensitivity and higher power consumption than a MTJ sensor.

As can be seen from the above, current AMR, Hall, and GMR triaxial sensors are disadvantageous in that they have excessive size, high packaging cost, lower sensitivity, higher power consumption, and the manufacturing methods are impractical.

SUMMARY OF THE INVENTION

To resolve the above problems, the present invention provides a compact triaxial sensor with higher sensitivity and lower power consumption.

The technical solution adopted in the present invention is as follows: A triaxial magnetoresistive sensor, comprising a substrate integrated with a biaxial sensor, a Z-axis sensor that has a sensing direction along Z-axis, and an ASIC; The biaxial magnetic field sensor includes an X-axis magnetic field sensor that has a sensing direction along the X-axis and a Y-axis magnetic field sensor that has a sensing direction along the Y-axis; the Z-axis magnetic field sensor and the biaxial magnetic field sensor are electrically interconnected with the ASIC Any two of the X-axis, Y-axis, and Z-axis mutually orthogonal.

Preferably, the X-axis and the Y-axis magnetic field sensors are MTJ magnetic field sensor bridges; the X-axis bridge sensor is a referenced bridge sensor and the Y-axis bridge sensor is a push-pull sensor.

Preferably, the biaxial magnetic field sensor can be provided on a single die, but it may also be provided using separate dice.

Preferably, the biaxial magnetic field sensor is electrically interconnected to the ASIC using gold wire bonds.

Alternatively, the biaxial magnetic field sensor is electrically interconnected with the ASIC using solder bumps.

Preferably, the Z-axis magnetic field sensor is a MTJ sensor positioned horizontally on the substrate using a solder bump connection, wherein the Z-axis magnetic field sensor has a sensing direction perpendicular to the surface of the Z-axis sensor.

Alternatively, the Z-axis magnetic field sensor is a MTJ magnetic field sensor with the sensitive direction parallel to the chip surface, and the Z-axis MTJ sensor is vertically disposed on the substrate using a solder bump connection.

Alternatively, the Z-axis magnetic field sensor is a MTJ sensor, wherein the Z-axis sensor chip is rotated obliquely on the substrate.

Alternatively, the Z-axis magnetic field sensor is a Hall Effect or giant Hall Effect magnetic field sensor.

A single-chip three-axis magnetic field sensor, which comprises a substrate integrated with a biaxial magnetic field sensor, a Z-axis magnetic field sensor that has a sensing direction along the Z-axis, and an ASIC, wherein the biaxial magnetic field sensor includes a X-axis sensor that has a sensing direction along the X-axis and a Y-axis sensor that has a sensing direction along the Y-axis, such that any two of the X, Y, and Z axes are mutually orthogonal.

Preferably, the X-axis sensor bridge and the Y-axis sensor bridge are MTJ sensor bridges.

Preferably, the triaxial magnetic field sensor element, the insulation layer, the ASIC, and the substrate are stacked, and said insulation layer is provided with copper conductors positioned to connect said three-axis magnetic field sensor element and said ASIC.

Preferably, the insulation layer, the ASIC, the substrate, and the triaxial sensor element are stacked, and copper conductor are positioned on the substrate in order to electrically connect the triaxial sensor element with the ASIC.

Preferably, the copper conductors are fabricated using silicon via (TSV) technology.

Preferably, the Z-axis magnetic field sensor is a perpendicular magnetic anisotropy MTJ sensor chip positioned horizontally on the substrate, wherein the sensing direction of the Z-axis sensor is perpendicular to the surface of the Z-axis MTJ sensor chip.

Alternatively, the Z-axis magnetic field sensor is a Hall Effect or a giant Hall Effect magnetic field sensor chip.

Preferably, the Z-axis sensor is a MTJ sensor chip, wherein the Z-axis sensor chip is rotated obliquely with respect to the substrate, and the Z-axis sensor is electrically connected to the ASIC by a copper conductor.

The above design provides a highly integrated sensor with high sensitivity, low power consumption, good linearity, wide dynamic range, excellent thermal stability, and low magnetic noise.

In the figures, 1 is a MTJ element; 2 a Magnetic pinned layer; 3 an antiferromagnetic layer; 4 a ferromagnetic layer; 5 a tunnel barrier layer; 6 a ferromagnetic free layer; 7 the magnetic direction of the ferromagnetic free layer; 8 the magnetic direction of the ferromagnetic pinned layer; 9 an applied magnetic field; 10 a sensing direction; 11 a seed layer; 12 an upper electrode; 13 the resistance of an MTJ element; 14 The low resistance value of an MTJ element; 15 the high resistance value of an MTJ element; 16 electric current; 17 a permanent magnet; 18 a substrate; 19 an ASIC; 20. a MTJ bridge sensor; 21 a solder bump; 22 an X-axis bridge sensor; 23 a Y-axis bridge sensor; 24 a Z-axis sensor; 25 a gold bond wire; 26 a solder bump; 27 an insulation layer; 28 a copper conductor; 29 a biaxial sensor; 30 a triaxial sensing element; 41 The direction of the magnetization of the free layer R1; 42 The direction of the magnetization of the free layer R2; 43 The direction of the magnetization of the free layer R3; 44 The direction of the magnetization of the free layer R4.

DESCRIPTION OF THE PREFERRED EMBODIMENTS

Below in conjunction with the accompanying drawings 1-18 preferred embodiments of the present invention are elaborated, such that the advantages and features of the present invention are more easily understood by those skilled in the art, so that the scope of protection of the present invention is clearly defined.

Figure 1:
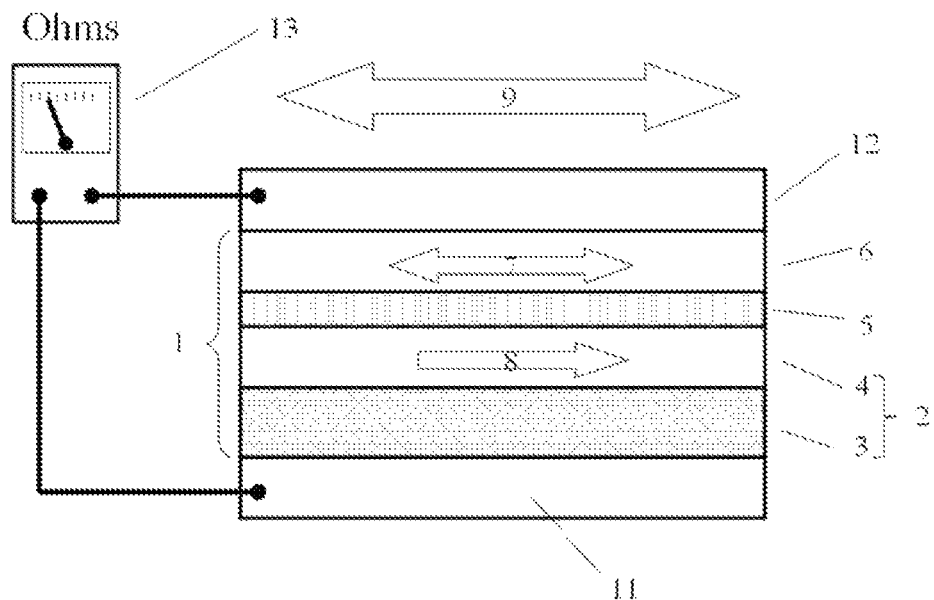
FIG. 1 is a schematic drawing of the magnetic resistance of a magnetic tunnel junction element.

Tunnel junction magnetoresistance overview:

FIG. 1 is a schematic view of a standard MTJ element. The standard MTJ element 1 includes a free ferromagnetic layer 6, a ferromagnetic pinned layer 2, and a tunnel barrier layer 5 between the ferromagnetic layers. The free ferromagnetic layer 6 is composed of a ferromagnetic material, and the magnetization direction of the ferromagnetic free layer is able to change in response to an external magnetic field. The ferromagnetic pinning layer 2 has a magnetization direction that is pinned in one direction, and it does not change under general operating conditions. A ferromagnetic pinned layer 4 may be either at the top or bottom of the antiferromagnetic layer 3. The MTJ structure is usually deposited on top of a conductive seed layer 11, while an electrode 12 is usually deposited on top of the MTJ structure. The resistance of the MTJ element is measured between the seed layer 11 and the upper electrode layer 12, and its value 13 is representative of the relative orientation of the magnetizations of the ferromagnetic free layer 6 and the ferromagnetic pinned layer 2.

Figure 2:
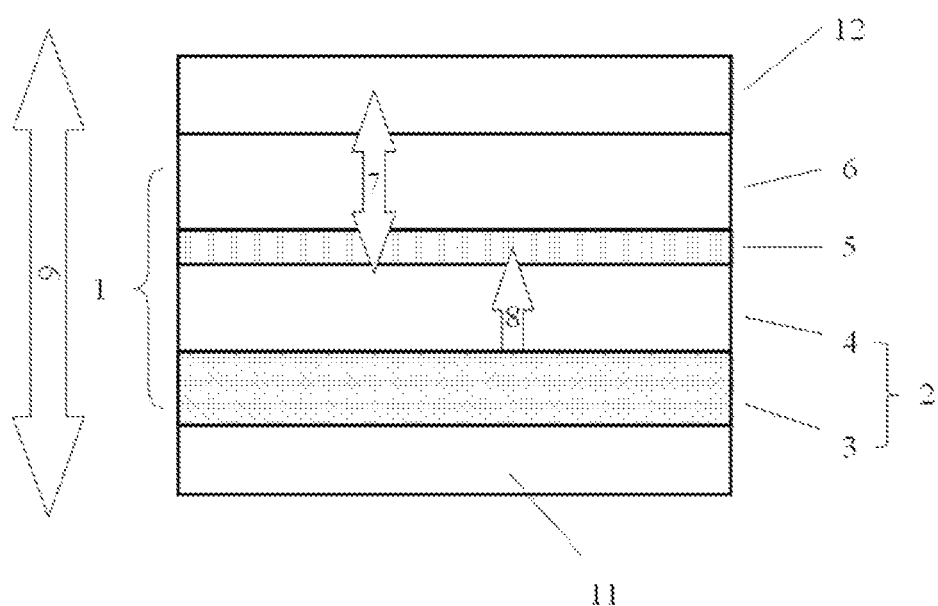
FIG. 2 is a schematic drawing of an MTJ element with perpendicular magnetic anisotropy.

FIG. 2 is a schematic diagram of a perpendicular magnetic anisotropy MTJ element. The difference between the standard MTJ element and a perpendicular magnetic anisotropy MTJ element is the ferromagnetic pinning layer magnetization direction 8 and the magnetization direction of the ferromagnetic free layer 7 are aligned along the direction perpendicular to the film surface, that is, the sensitive direction of the MTJ is perpendicular to the film (chip) surface. A perpendicular magnetic anisotropy MTJ element has the same seed layer 11 as the standard MTJ element, and likewise the resistance value 13 is measured between the upper electrode layer 12 and the seed layer 11, and it represents the relative orientation of the magnetization of the ferromagnetic free layer 6 and the ferromagnetic pinned layer 2.

Figure 3:
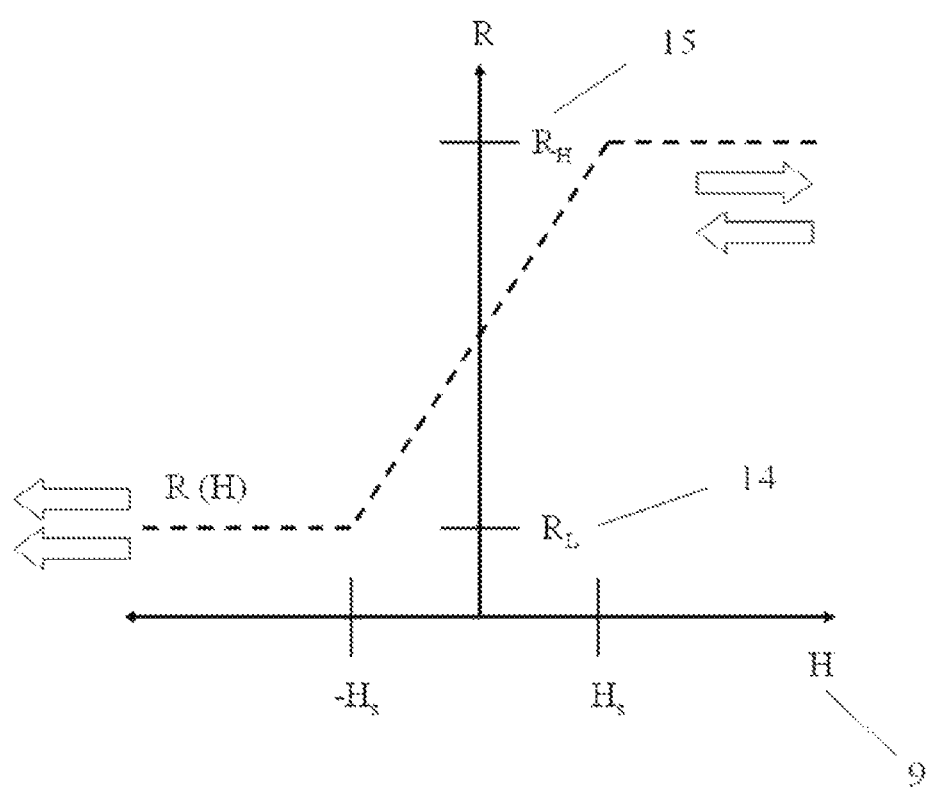
FIG. 3 is a graph of the ideal output of an MTJ element.

FIG. 3 is an ideal output response curve of an MTJ element, the output curve in the low-resistance state $R_L$ 14 and the high-impedance state $R_H$ 15, represent the low-resistance state 14 and the high-resistance state 15 of the saturated MTJ. When the magnetic free layer 7 magnetization direction and magnetic pinning layer 8 direction of magnetization are parallel, the measured resistance value 13 of the MTJ is the low-resistance state; when the magnetization direction of the ferromagnetic free layer 7 and the magnetization direction of the ferromagnetic pinned layer 8 are anti-parallel, the resistance value of the MTJ element 13 is the high-resistance value 15. By known techniques, the resistance of the MTJ element 1 is made linear as a function of applied magnetic field in the magnetic field range between the high-resistance state and the low resistance state, the saturation fields $-H_s$ and $H_s$ then define the linear range of the MTJ element.

Figure 4:
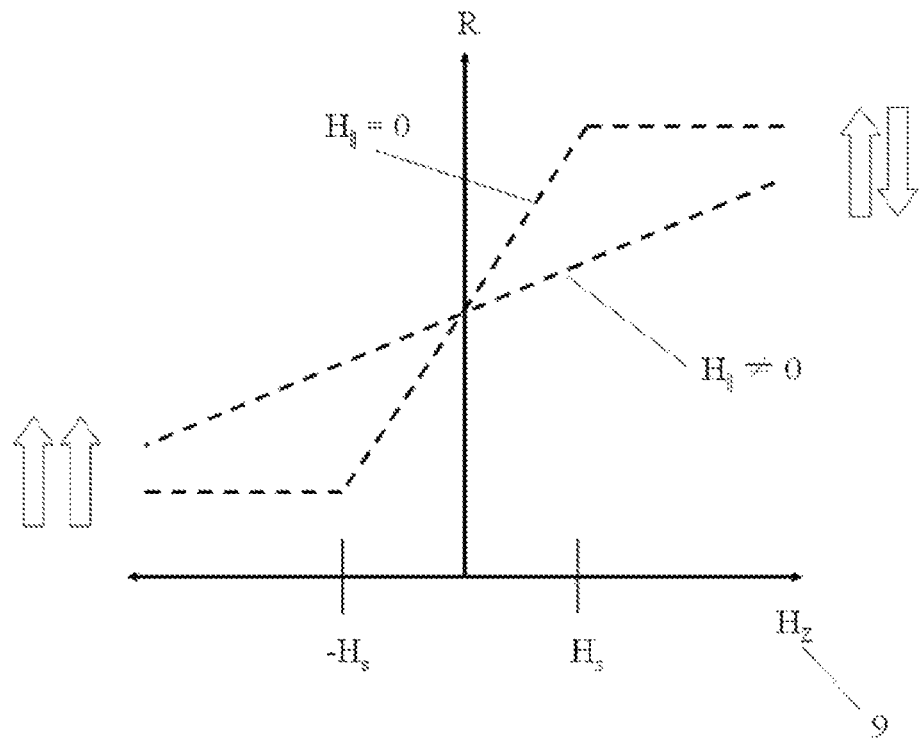
FIG. 4 is a graph of the ideal output of a perpendicular magnetic anisotropy MTJ element.

FIG. 4 illustrates the ideal response of a perpendicular magnetic anisotropy MTJ element. When the component of the applied field parallel to the film surface is 0, the output curve of the perpendicular magnetic anisotropy MTJ element can have high sensitivity and low saturation field. However, in the usual case, the external field component of a direction parallel to the film surface direction is not 0, and under such conditions, the perpendicular magnetic anisotropy MTJ element has low sensitivity, high saturation field $H_s$ value compared to a standard MTJ element, but relative to the Hall and giant Hall element it is much better and thus advantageous.

Figure 5:
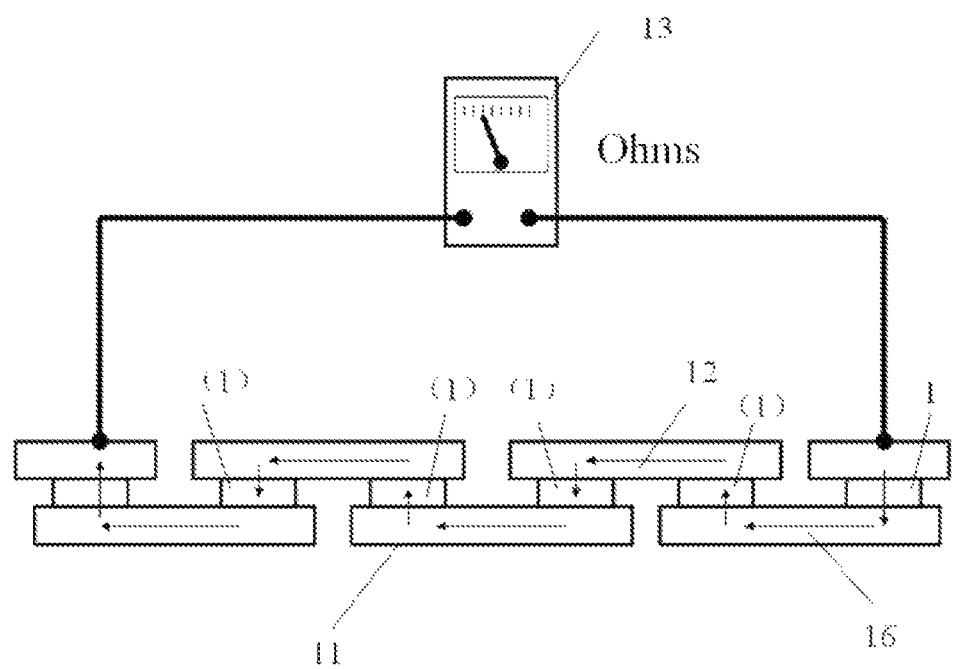
FIG. 5 is a schematic diagram of MTJ elements electrically connected in series.

FIG. 5 is a schematic view of several MTJs connected in series to form a magnetoresistive element. A string of connected MTJs 1 can reduce noise and improve the stability of the sensor. In MTJ magnetoresistive element 24, the bias voltage of each MTJ 1 is decreased proportionally to the number of MTJs in the string. This reduces the current required to generate a large voltage output, thereby reducing the shot noise, and it also improves the ESD tolerance of the sensor. In addition to improving the output signal and increasing ESD tolerance, increasing the number of MTJs improves noise performance because uncorrelated random behavior of each individual MTJ element is averaged out.

Figure 6:
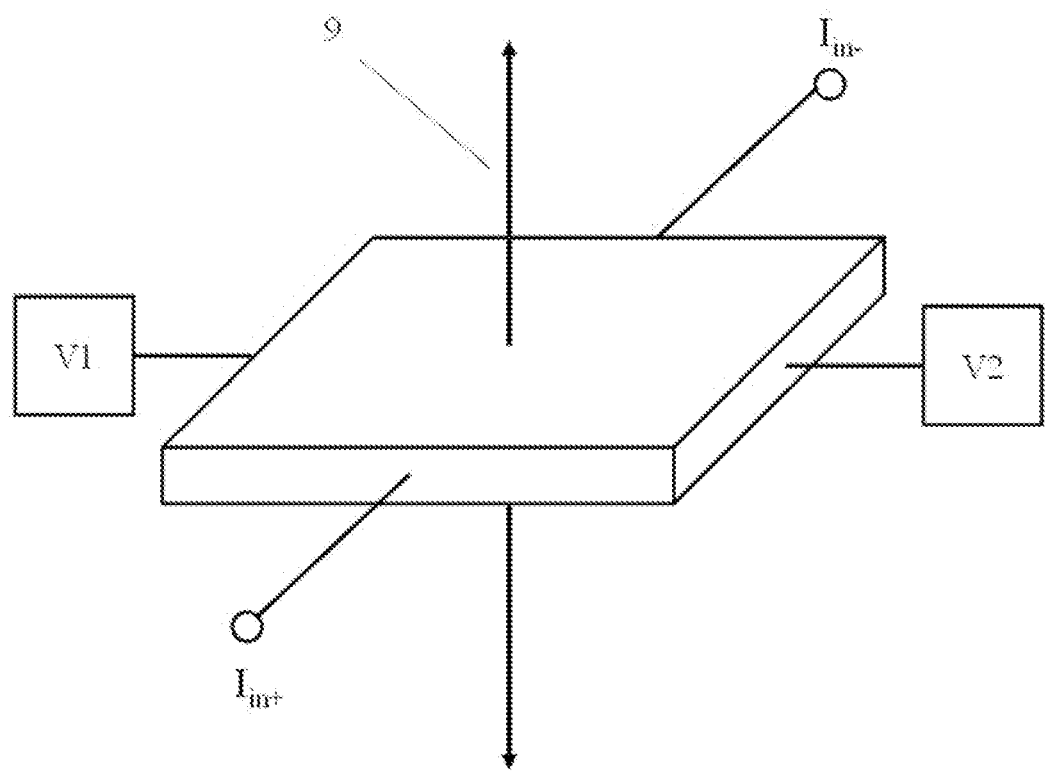
FIG. 6 is a schematic diagram of the Hall or giant Hall element.
Figure 7:
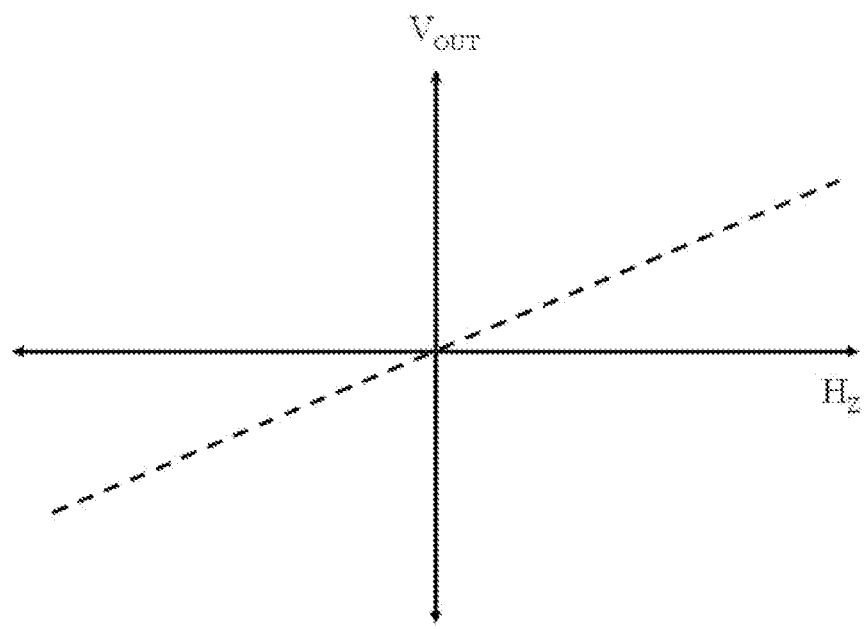
FIG. 7 is a graph of the ideal output of a Hall element.

FIG. 6 is a schematic view of a Hall or giant Hall element. Here, $I_{in}+$ and $I_{in}-$ are current input and output terminals, $V_1$ and $V_2$ are the voltage output terminals. When a steady current I+ flows between and $I_{in}-$ and $I_{in}+$, a magnetic field (the direction perpendicular to the plane formed by the current terminals and the voltage terminals) applied to the Hall or giant Hall element, will generate a differential voltage between terminals $V_1$ and $V_2$. The ideal output curve is shown in FIG. 7.

Figure 8:
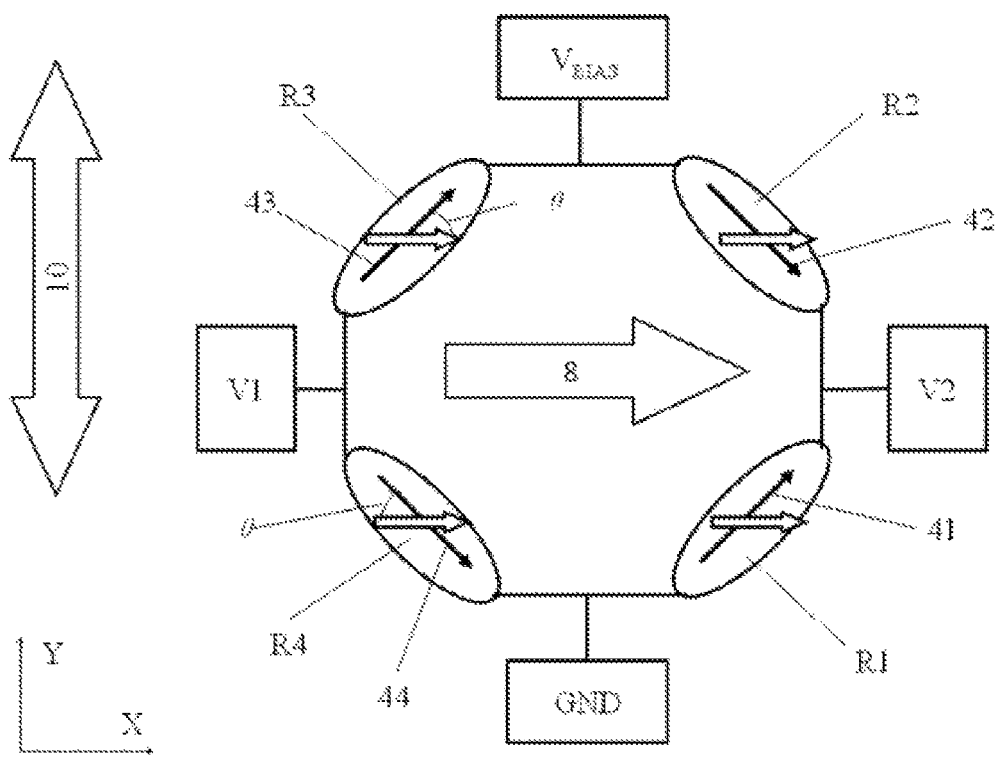
FIG. 8 is a schematic diagram of a MTJ push-pull bridge sensor.

Push-pull bridge sensor design:

FIG. 8 is a schematic diagram of a MTJ push-pull full-bridge sensor. The four MTJ elements R1, R2, R3, and R4 are interconnected as a full-bridge, and each MTJ element is composed of one or a plurality of MTJs 1 connected in series (FIG. 2). For each of the magnetoresistive elements the magnetization direction of the pinned layer is the same, and the freelayer magnetization direction with respect to the pinned layer magnetization direction at is at an angle 9 (between 30° to 90°, and this angle Θ is the same magnitude. Magnetoresistive element pairs (R1 and R3, R2 and R4) have the same free layer magnetization direction (41 and 43, 42 and 44), while magnetoresistive elements located adjacent to each other (R1 and R2, R3 and R4) have freelayer magnetization aligned in different directions (41 and 42, 43 and 44). In this specific full-bridge configuration, the sensitive direction 10 is perpendicular to the ferromagnetic pinned layer's magnetization direction 8. Because the magnetization direction of the magnetic pinned layer 8 of each of the magnetoresistive elements is the same, this push-pull full bridge sensor design can be implemented on a single chip to form a push-pull full bridge sensor, without the use of a multi-chip packaging process or the need to perform local laser heating.

When a magnetic field is applied along the sensitive direction 10, it changes the relative orientation of the freelayer magnetization relative to the pinned layer magnetization. Therefore, magnetoresistive elements such that R1 and R3 show a resistance increase while the other two magnetoresistive elements R2 and R4 show a decreasing resistance. When the magnetic field is applied in the opposite direction then R1 and R3 resistance will be reduced while R2 and R4 resistance will be increased. The use of a combination of two pairs of magnetoresistive elements that have opposite response to the applied field, that is, a pair of MTJ elements has a resistance that increases while the other has a resistance that decreases, effectively doubling the response of the bridge circuit, produces what is called a "push-pull" bridge. In the ideal case, if the resistance value of resistor R1=(R1+ΔR), R3=(R1+ΔR), R2=(R2−ΔR), and R4=(R2−ΔR), the bridge output becomes:

$$V1 - V2 = \frac{R2 - \Delta R - (R1 + \Delta R)}{R2 + R1} V_{bias} \quad (1)$$

Ideally, when R1=R2>ΔR, the equation can be simplified:

$$V1 - V2 \approx \frac{-2\Delta R}{R2 + R1} V_{bias} \quad (2)$$

Figure 9:
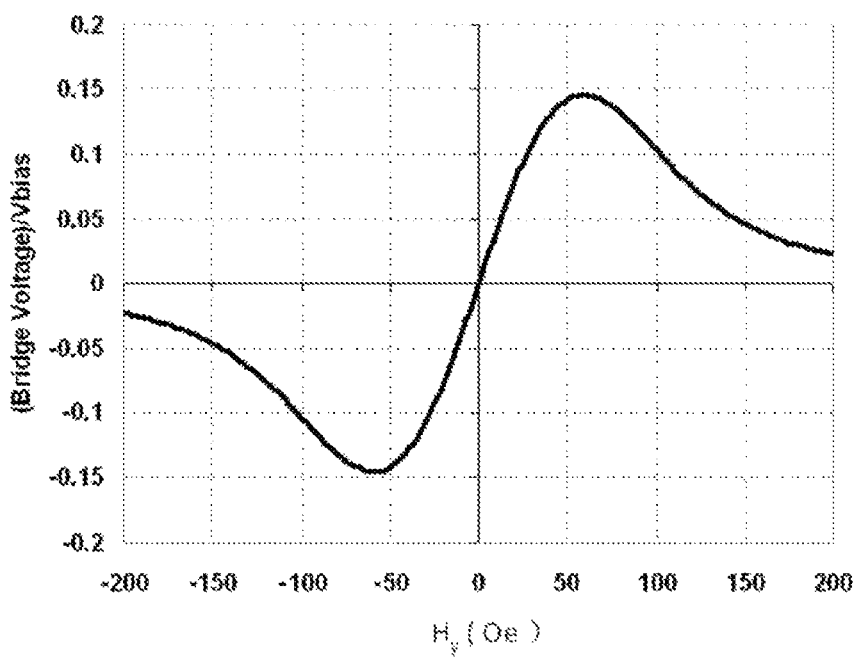
FIG. 9 is a plot of the analog output of a MTJ push-pull bridge sensor.

The simulated response for this push-pull bridge circuit is shown in FIG. 9.

The required magnetization angle between the ferromagnetic free layer and the ferromagnetic pinned layer may be achieved in the following ways:

(1) Shape Anisotropy: Use shape anisotropy of the MTJ element to create easy magnetization axes, in order to bias the magnetic free layer magnetization directions. Shape anisotropy of the of the MTJ element is can be adjusted by changing the length relative to the width of the MTJ element, and also by rotating the elements;

(2) Permanent Magnet Bias: Set permanent magnets around the MTJ element to produce a field to bias the free layer magnetization direction;

(3) Coil Bias: Deposit metal wires used to carry a current for generating a magnetic field in layers above or below the MTJ elements, in order to produce a field to bias magnetic free layer directions;

(4) Neel Coupling: Use the Neel Coupling field between the ferromagnetic pinned layer and the ferromagnetic free layer to bias ferromagnetic free layer magnetization;

(5) Exchange Bias: In this technique, weak exchange coupling to an adjacent antiferromagnetic layer on the freelayer creates an effective bias field. The strength can be tuned by placing a Cu or Ta layer between the antiferromagnetic layer and the freelayer, which reduces the strength of exchange bias.

Figure 10:
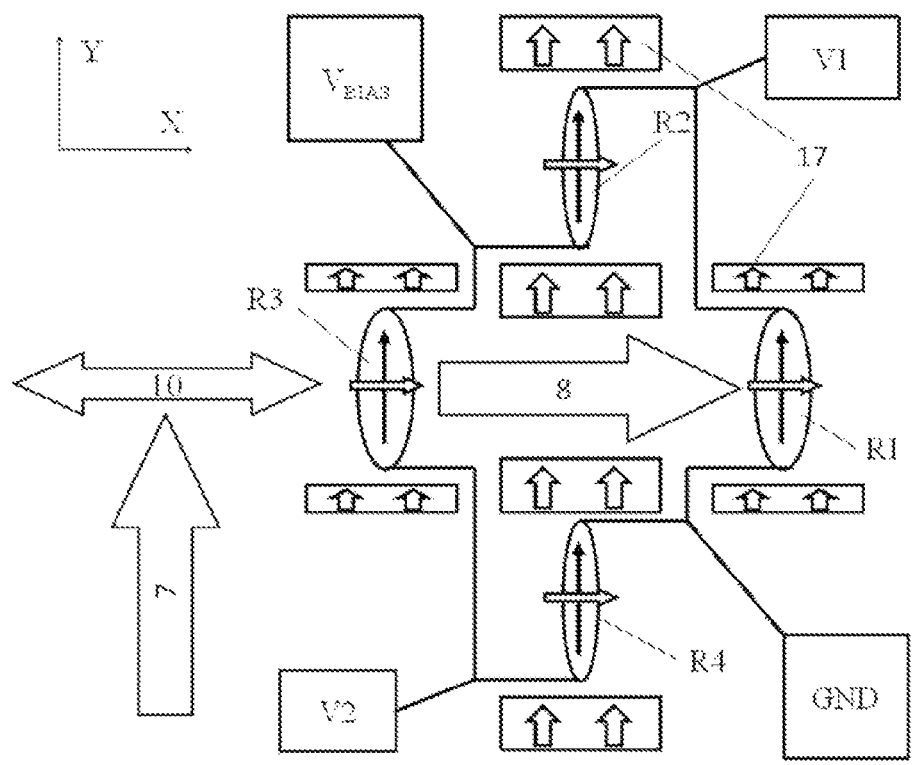
FIG. 10 is a schematic diagram of a MTJ referenced bridge sensor.

Referenced Full-Bridge Magnetic Sensor Design:

FIG. 10 shows a schematic diagram of a referenced full bridge MTJ sensor. Here, four MTJ magnetoresistive elements R1, R2, R3 and R4 are interconnected to form a bridge, and each magnetoresistive element is composed of one or more MTJs connected in series (FIG. 2). In this design, the output curve of magnetoresistive elements R1 and R3 are strongly dependent on the applied magnetic field 9, and these elements are referred to as the sensing arms. The magnetoresistive response of elements R2 and R4, on the other hand, is only weakly dependent on the applied magnetic field 9, and these elements are called the reference arms. The sensitive direction of this referenced full-bridge structure 10 is parallel to the pinning direction 8. This specific referenced bridge design utilizes the same ferromagnetic pinned layer direction for all bridge arms, and it can thus be built on the same chip as the push-pull full bridge sensor, without the use of a multi-chip packaging process or local laser heating.

Figure 11:
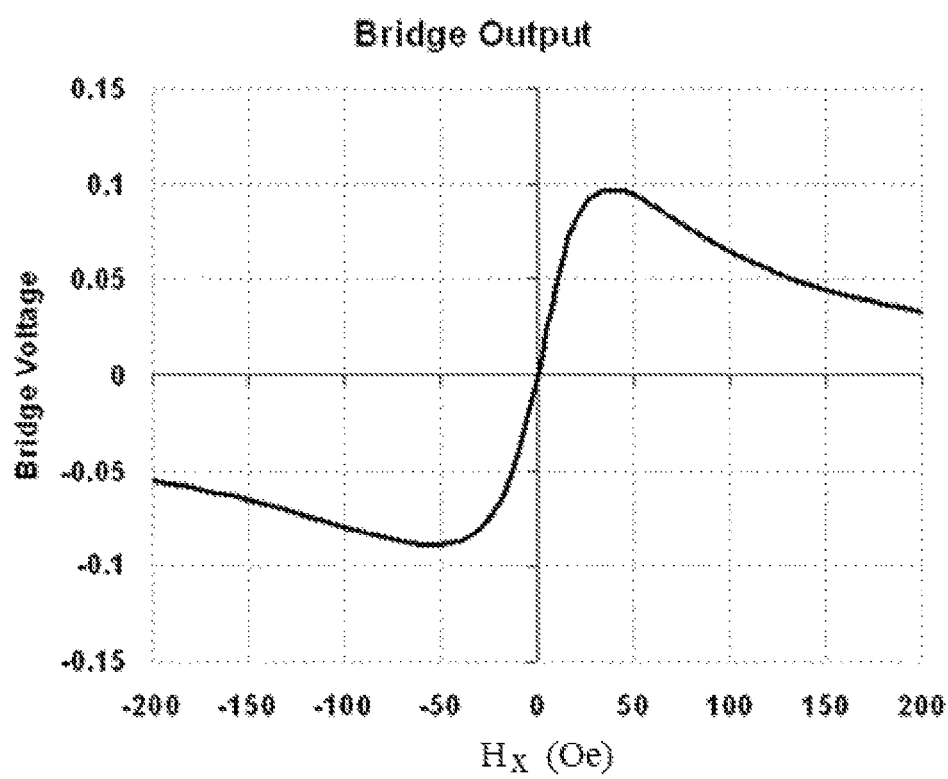
FIG. 11 is simulation plot of the output of a MTJ referenced bridge sensor.

When a field is applied to the referenced push-pull full bridge sensor, the magnetic field component along the sensitive direction causes the sensor arms R1 and R3 to increase or decrease in resistance, while the reference arm elements R2 and R4 do not change much. In practice, the output of the referenced MTJ full-bridge sensor is linear over a wide field range. A simulation output response curve is shown in FIG. 11.

In order to build a practical referenced bridge sensor, it is important to set different sensitivities for the sense and reference arms. The sensitivity of a magnetoresistive element is defined as the change in resistance as a function of applied magnetic field:

$$S_{hff3} = \frac{1}{2}\left(\frac{R_H - R_L}{R_H + R_L}\right)\left(\frac{V_{bias}}{H_s}\right) \quad (3)$$

It is not practical to reduce the magnetoresistance of the reference arm with respect to the sensor arm, so the relative change in sensitivity between the reference and sense arms is best accomplished by changing H. This can be accomplished through any one of or a combination of the following methods:

(1) Magnetic Shielding: A high permeability ferromagnetic layer is deposited over the reference arm in order to attenuate the applied magnetic field;

(2) Shape Anisotropy: Pattern the reference and the sense elements into different sizes, therefore have different shape anisotropy energies and thus different sensitivities. It is most common to vary the length to width ratio of the sensing elements such that the demagnetizing field of the reference elements is much larger than the demagnetizing fields of the sensing elements;

(3) Exchange Bias: This technique is used to create a bias field on the free layer of the MTJ element perpendicular to the sensitive direction of the MTJ element by using weak exchange coupling to an antiferromagnetic layer. A Cu or Ta barrier layer may be provided between the free layer and the exchange bias layer to reduce the strength of the exchange bias;

(4) In-Stack Bias: In this technique, permanent magnet alloys of Fe, Co, Cr or Pt are deposited onto the surface of the sensor element of the magnetic tunnel junction, and the resulting stray field biases the MTJ element A large magnetic field can then be used to initialize the sensor at different angles. A very important advantage is that the bias field can eliminate the magnetic domains in the MTJ element to improve the stability and linearity of the MTJ element, and the direction of the magnetization can be adjusted to provide great flexibility in tuning the response.

Single-Chip Biaxial Magnetic Sensor Design:

Because the sensors are comprised of magnetoresistive films deposited simultaneously on the same wafer, the pinned layer magnetization directions of the areas used to make different sensor axes are the same. Unfortunately, the biaxial magnetic field sensors consist of two bridge sensors that must be rotated at a 90° angle with respect to each other. In the following we will describe the realization of the single chip biaxial magnetic field sensor. Single chip MTJ-axis magnetic field sensor design can be achieved through the following methods or combination of several methods:

Method 1: Local Laser Heating: After deposition the pinned layers of the different sensor bridges are aligned parallel to each other. A local laser pulse may be applied in the presence of a magnetic field to realign the pinned layer in specific areas;

Method 2: Multiple Depositions: Different magnetoresistive films may be deposited on different areas of the chip to achieve the correct pinned layer orientation for each sensor.

Method 3: Referenced/Push-Pull: A single chip MTJ biaxial magnetic field sensor may be achieved as shown on FIG. 12. Full bridge and referenced bridge sensors can be developed that are sensitive to fields parallel or perpendicular to the pinned layer direction. These full-bridge sensors can be built on the same substrate using the same steps and the same ferromagnetic pinned layer 8 set direction.

Triaxial Magnetic Field Sensor Design:

A triaxial magnetic sensor includes a substrate, the substrate includes a biaxial magnetic field sensor 29, a Z-axis magnetic field sensor element 24 and an ASIC 19, said biaxial magnetic sensor 29 is integrated onto the substrate 18 and it contains an X-axis the bridge magnetic field sensor 22 sensitive to fields in the X-direction and a Y-axis the bridge magnetic field sensor 23 sensitive to magnetic fields in the Y-direction. Said biaxial magnetic field sensor 29 and the Z-axis magnetic field sensor 24 are connected to the ASIC 19, and each of the X, Y and Z axes are mutually orthogonal. The ASIC is used for signal conditioning.

Figure 15:
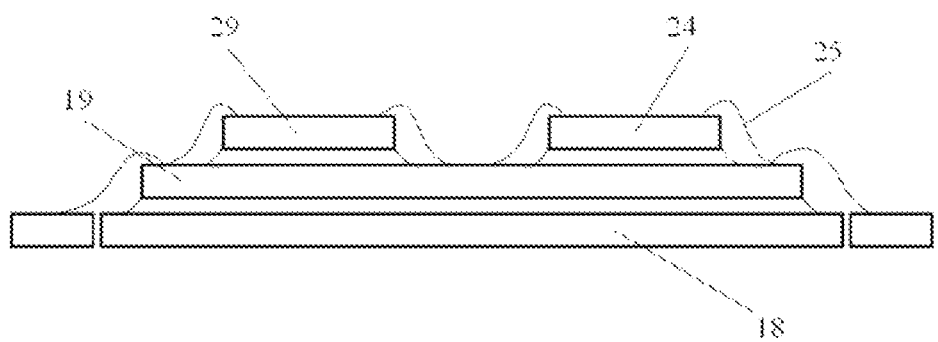
FIG. 15 is a schematic view of the chip stack and wire bonding process used to achieve a triaxial magnetic field sensor.

FIG. 15 shows a triaxial magnetic field sensor chip fabricated using a stack and wire bond process in which the ASIC element 19 is mated with a biaxial magnetic field sensor 29 chip and a Z-axis magnetic field sensor 24 chip. The biaxial magnetic field sensor 29 includes an X-axis full bridge magnetic field sensor 22 and a Y-axis magnetic field full bridge sensor 23. The biaxial magnetic field sensor 29 and the Z-axis magnetic field sensor 24 are stacked on the surface of the ASIC 19, and gold wire bonds 25 are used to electrically interconnect the biaxial magnetic field sensor 29, the Z-axis magnetic field sensor 24, and the ASIC 19.

Figure 16:
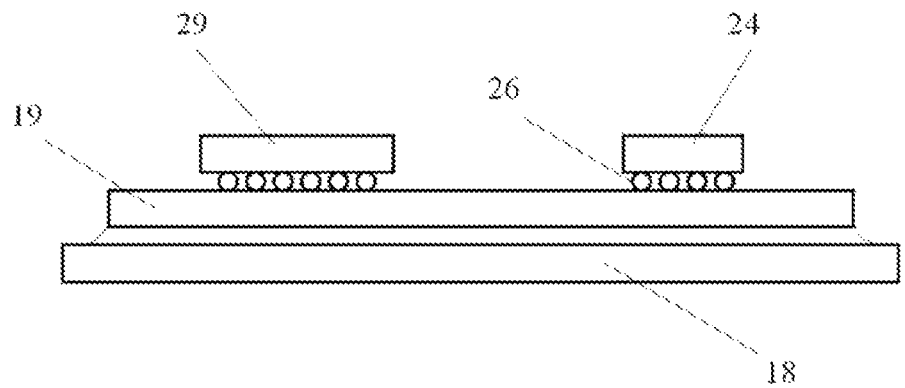
FIG. 16 is a schematic diagram of the triaxial magnetic field sensor flip-chip process.

FIG. 16 illustrates the stack and the flip chip process for building a triaxial magnetic field sensor. Here, the ASIC 19 is combined with a biaxial magnetic field sensor 29 and a Z-axis magnetic field sensor 24, where said biaxial magnetic field sensor 29 contains an X-axis bridge magnetic field sensor 22 and a Y-axis bridge magnetic field sensor 23. As shown in FIG. 16, the biaxial magnetic field sensor 29 and the Z-axis magnetic field sensor 24 are stacked on the surface of the ASIC 19, and tin solder balls 26 are used to electrically and mechanically connect the biaxial magnetic field sensor 29 and the Z-axis magnetic field sensor 24 to the ASIC 19.

Figure 13:
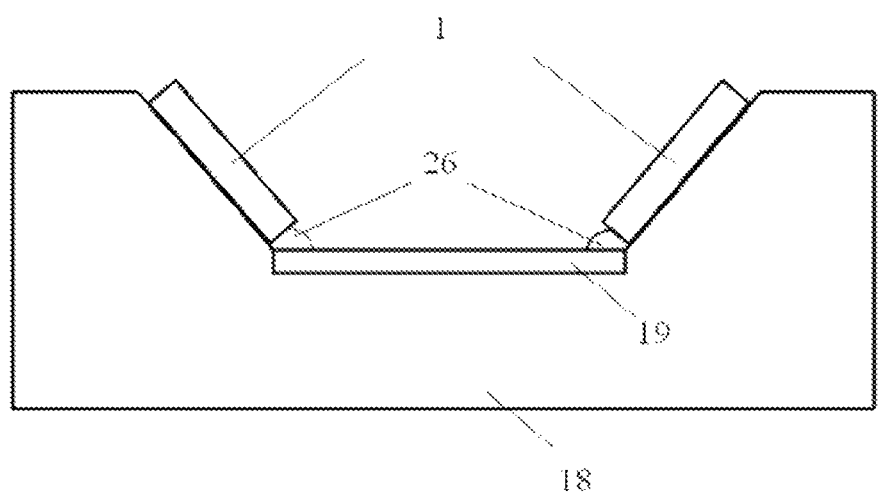
FIG. 13 is a schematic view of the MTJ sensor Z-axis magnetic field sensor fixed on an incline.

In order to provide Z-axis sensing capability, the Z-axis sensor may be achieved by several methods including:

(1) As shown in FIG. 13 the MTJ bridge sensors can be built on to an inclined surface. FIG. 13 is a schematic view of a MTJ bridge sensor chip attached to an inclined surface, the MTJ sensor chips are sensitive to the magnetic field component parallel to their surface, but in combination can detect the Z-axis component of the field applied, so that they are sensitive only to a field applied in the Z axis direction.

in a first embodiment of FIG. 13, the substrate 18 is wet etched to form the beveled groove, wherein MTJ elements are placed onto opposite slopes and connected through solder bumps to the ASIC component. The relative placement of the MTJ chips can cancel X and Y-axis cross-axis sensitivity and increase sensitivity to fields in the Z-axis direction. To enhance its sensitivity for the Z-axis direction the MTJ sensors can be a full bridges using various implementations including those shown in FIG. 8 and FIG. 10.

In the second embodiment of FIG. 13, the substrate 18 prepared by wet etching to form the beveled grooves, and then MTJ bridge sensors are placed onto the opposite slopes of the groove and connected to the ASIC 19 through the solder bump, the corresponding placement the of the MTJ bridges can cancel X, Y-axis cross-axis sensitivity and increase sensitivity to fields in the Z-axis direction. The two MTJ the bridge magnetic field sensors can be push-pull full bridge sensor (FIG. 8) or referenced full-bridge sensors (FIG. 2).

Figure 14:
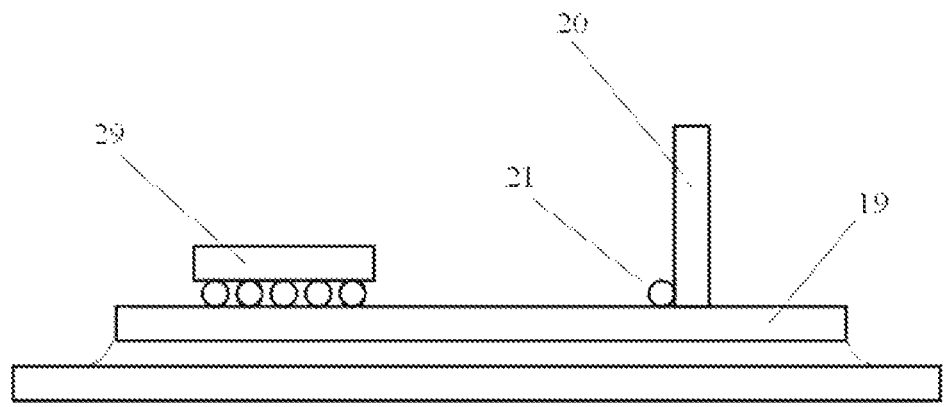
FIG. 14 is a schematic diagram of the Z-axis mounted perpendicular to the MTJ bridge sensor.

(2) FIG. 14 shows a vertically mounted MTJ bridge sensor. FIG. 14 shows vertically mounted MTJ bridge sensor schematic wherein the edge of the MTJ bridge sensor 20 has solder bumps 21 that are used to set the MTJ bridge sensor 20 onto the ASIC element 19 with a the 90° angle, and the solder bump 21 provides electrical connection to the ASIC 19, the chip is now sensitive to Z-axis magnetic field.

(3) As shown in FIG. 2, the magnetic field bridge sensors may comprise perpendicular magnetic anisotropy MTJ elements, and these can be configured as a push-pull bridge sensor or as a referenced bridge sensor. The perpendicular magnetic anisotropy MTJ bridge sensor stacked on the ASIC 19 and electrically interconnected thereto;

(4) The Z-axis sensor may be built from Hall Effect or giant Hall Effect sensors. As shown in FIG. 6, the output terminals of the Hall Effect sensor or giant Hall Effect sensor are perpendicular to the direction of the current and the applied magnetic field, therefore the sensor can be constructed with output terminals V1 and V2 parallel and current terminals parallel to the film surface, such that placing the sensor on the surface causes the sensor to detect the Z-axis magnetic field.

Figure 17:
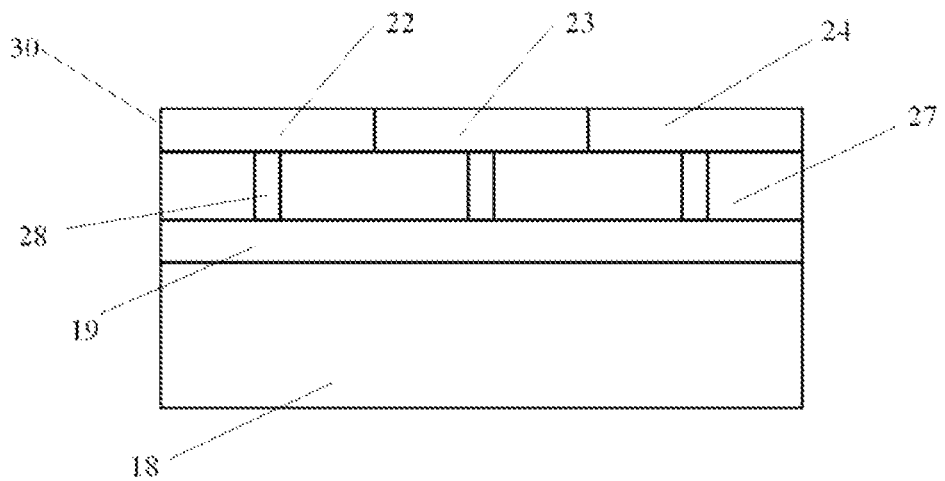
FIG. 17 is a schematic diagram of a single chip MTJ triaxial magnetic sensor.

Single-Chip Triaxial TMR Magnetic Field Sensor Design: FIG. 17 is a schematic diagram of a single chip triaxial MTJ magnetic sensor. Shown in FIG. 17, the substrate 18 contains the ASIC 19 circuitry, the surface of the ASIC component is an oxide passivation layer 27, the passivation layer 27 is smoothed using chemical mechanical polishing. After polishing the triaxial magnetic field sensor unit 30 is built onto the ASIC element 19. The triaxial magnetic field sensor unit 30 comprises an X-axis bridge sensor 22, a Y-axis bridge sensor 23, a Z-axis bridge sensor 24. The ASIC 19, the X-axis magnetic field bridge sensor 22, the Y-axis bridge magnetic field sensor 23, the Z-axis magnetic field bridge sensor 24 are electrically interconnected through the copper vias 28. The copper vias 28 may be manufactured using standard semiconductor processes such as coating with photoresist, exposure, plating (deposition), and a second exposure step.

Figure 12:
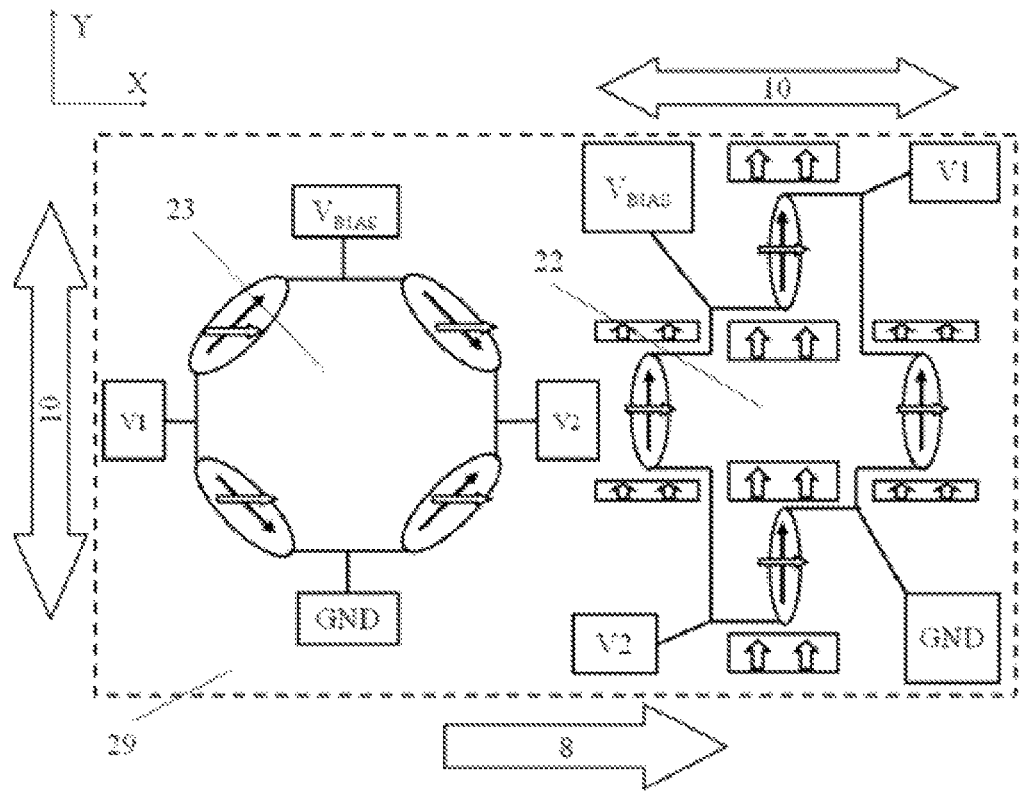
FIG. 12 is a schematic view of a type of single-chip biaxial magnetic field sensor.

For the X-axis sensor, an X bridge type magnetic field sensor 22 is used, and for the Y-axis sensor, a Y-axis the bridge magnetic field sensor 23 is used. The sensor bridges utilize a conventional MTJ element 1. This implementation is shown in FIG. 12.

The Z-axis sensor may be a Z-axis magnetic field sensor 24 chips fixed on a slope (FIG. 13), and it also may be a perpendicular magnetic anisotropy MTJ sensor (see FIG. 2), or it could be a Hall or giant Hall Effect magnetic field sensor (FIG. 7).

Figure 18:
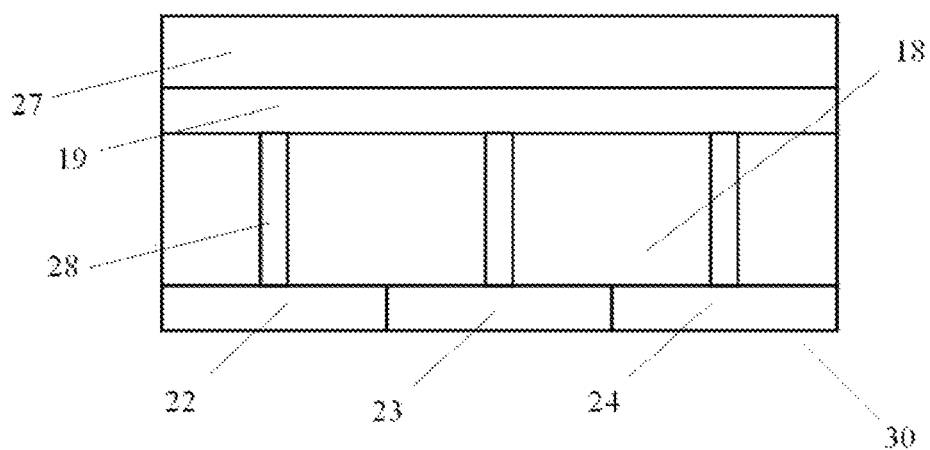
FIG. 18 is a schematic view of another single-chip MTJ triaxial magnetic sensor.

FIG. 18 is a schematic view of another single chip MTJ-axis magnetic sensor. As shown in FIG. 17, the substrate 18 contains the ASIC element 19, an oxide passivation layer 27 on the surface of the ASIC 19, the three-axis magnetic field sensor unit 30 is located at the back surface of the substrate 18, the three-axis magnetic field sensor unit 30 includes sensor bridges for the X axis 22, Y-axis 23, and Z-axis 24. The ASIC component 19, the X-axis magnetic field sensor 22, the Y axis bridge magnetic field sensor 23, and the Z-axis magnetic field sensor 24 are interconnected through the copper vias 28. The copper vias 28 are through silicon vias manufactured utilizing semiconductor processing, such as wet etching, dry etching, and electroplating (deposition).

For the X-axis sensor, an X bridge type magnetic field sensor 22 is used, and for the Y-axis sensor, a Y-axis the bridge magnetic field sensor 23 is used. The sensor bridges utilize a conventional MTJ element 1. The implementation is shown in FIG. 1.

For Z-axis sensing, a Z-axis magnetic field sensor 24 may use MTJ magnetic field sensor chips fixed on a slope (FIG. 13), or it also may use a perpendicular magnetic MTJ the magnetic field sensor (see FIG. 2), or it could also be a Hall Effect or giant Hall Effect magnetic field sensor (FIG. 7).

The above described embodiments demonstrate specific implementations of the present invention, and obviously other specific implementations exist that do not exceed the scope or spirit of the present invention. It will be apparent to those skilled in the art that various modifications can be made to the present invention without departing from the scope or spirit of the invention.

The invention claimed is:

1. A triaxial magnetoresistive sensor, comprising a substrate integrated with a biaxial sensor, a Z-axis sensor that has a sensing direction along the Z-axis, and an ASIC, wherein the biaxial sensor includes a X-axis bridge sensor that has a sensing direction along the X-axis and a Y-axis bridge sensor that has a sensing direction along the Y-axis, such that any two of the X, Y, and Z axes are mutually orthogonal, and wherein the Z-axis sensor and the biaxial sensor are both electrically connected to the ASIC,
wherein the z-axis sensor includes at least two MTJ sensors attached to opposite slopes of a beveled groove, each opposite slope being inclined with respect to the Z-axis, each of the at least two MTJ sensors having a surface and being sensitive to a magnetic field component parallel to their respective surface, and wherein the at least two MTJ sensors in combination are only sensitive to a magnetic field component in the Z-axis.

2. A triaxial magnetoresistive sensor as in claim 1, wherein the X-axis bridge sensor and the Y-axis bridge sensor are MTJ bridge sensors.

3. A triaxial magnetoresistive sensor as in claim 1, wherein the biaxial sensor is located on a single substrate.

4. A triaxial magnetoresistive sensor as in claim 1, wherein the biaxial sensor is electrically connected to the ASIC by gold bonding wires.

5. A triaxial magnetoresistive sensor as in claim 1, wherein the biaxial sensor is electrically connected to the ASIC using solder bumps.

6. A triaxial magnetoresistive sensor as in claim 1, wherein the X-axis bridge sensor is a referenced bridge sensor and the Y-axis bridge sensor is a push-pull sensor.

7. A triaxial magnetoresistive sensor as in claim 1, wherein the at least two MTJ sensors are symmetrically attached to opposite slopes of the beveled groove.

8. A triaxial magnetoresistive sensor as in claim 7, wherein the at least two MTJ sensors are configured to provide a sensing direction along the Z-axis.

9. A triaxial magnetoresistive sensor, comprising:
a substrate;
an ASIC stacked on the substrate; and
a triaxial sensor electrically connected to the ASIC using copper vias either through an insulation layer on the ASIC or through the substrate,
wherein the triaxial sensor includes a X-axis bridge sensor that has a sensing direction along a X-axis, a Y-axis bridge sensor that has a sensing direction along a Y-axis, and a Z-axis sensor that has a sensing direction along a Z-axis, wherein the Z-axis sensor includes at least two MTJ sensors attached to opposite slopes of a beveled groove, each opposite slope being inclined with respect to the Z-axis, each of the at least two MTJ sensors having a surface and being sensitive to a magnetic field component parallel to their respective surface, and wherein the at least two MTJ sensors in combination are only sensitive to a magnetic field component in the Z-axis, and wherein any two of X, Y, and Z axes are mutually orthogonal.

10. A triaxial magnetoresistive sensor as in claim 9, wherein the X-axis bridge sensor and the Y-axis bridge sensor are MTJ bridge sensors.

11. A triaxial magnetoresistive sensor as in claim 9, wherein the triaxial sensor, the insulation layer, the ASIC, and the substrate are stacked, and the insulation layer is provided with copper conductors positioned to electrically connect the components of the triaxial sensor and the ASIC.

12. A triaxial magnetoresistive sensor as in claim 9, wherein the insulation layer, the ASIC, the substrate and a triaxial sensor are arranged in a stack, wherein copper conductors pass through the substrate to interconnect the triaxial sensor with the ASIC.

13. A triaxial magnetoresistive sensor as in claim 9, wherein the triaxial sensor includes a Hall Effect or giant Hall Effect magnetic field sensor.

14. A triaxial magnetoresistive sensor as in claim 9, wherein the at least two MTJ sensors are configured to provide a sensing direction along the Z-axis.

* * * * *

UNITED STATES PATENT AND TRADEMARK OFFICE
CERTIFICATE OF CORRECTION

PATENT NO. : 9,733,316 B2  
APPLICATION NO. : 14/239786  
DATED : August 15, 2017  
INVENTOR(S) : Lei et al.

Page 1 of 1

It is certified that error appears in the above-identified patent and that said Letters Patent is hereby corrected as shown below:

On the Title Page

In item (73), in "Assignee", in Column 1, Line 1, delete "MultiDemension" and insert --MultiDimension-- therefor Signed and Sealed this
Twenty-fourth Day of April, 2018

Andrei Iancu
*Director of the United States Patent and Trademark Office*